United States Patent [19]

Kinsbron et al.

[11] Patent Number: 4,514,893

[45] Date of Patent: May 7, 1985

[54] FABRICATION OF FETS

[75] Inventors: Eliezer Kinsbron, Highland Park; William T. Lynch, Summit; Thomas E. Smith, Madison, all of N.J.

[73] Assignee: AT&T Bell Laboratories, Murray Hill, N.J.

[21] Appl. No.: 489,708

[22] Filed: Apr. 29, 1983

[51] Int. Cl.$^3$ .......................................... H01L 21/265
[52] U.S. Cl. ...................... 29/571; 29/576 B; 29/578; 29/591; 148/187
[58] Field of Search ............... 29/571, 576 B, 578, 29/591; 148/187

[56] References Cited

U.S. PATENT DOCUMENTS

| | | | |
|---|---|---|---|
| 3,866,310 | 2/1975 | Driver et al. | 29/571 |
| 4,080,718 | 3/1978 | Richman | 29/571 |
| 4,212,100 | 7/1980 | Pairinen et al. | 29/578 X |
| 4,212,684 | 7/1980 | Brower | 148/187 X |
| 4,217,149 | 8/1980 | Sawazaki | 148/187 X |
| 4,218,670 | 8/1980 | Gaensslen | 29/571 X |
| 4,284,647 | 8/1981 | Richman | 29/571 |
| 4,285,761 | 8/1981 | Fatula et al. | 29/571 X |
| 4,294,001 | 10/1981 | Kuo | 29/571 |
| 4,315,781 | 2/1982 | Henderson | 29/571 X |
| 4,338,616 | 7/1982 | Bol | 357/15 X |
| 4,343,082 | 8/1982 | Lepselter et al. | 29/576 B |
| 4,346,125 | 8/1982 | Kinsbron et al. | 427/96 |
| 4,362,597 | 12/1982 | Fraser et al. | 156/657 X |
| 4,378,628 | 4/1983 | Levinstein et al. | 29/571 |
| 4,411,734 | 10/1983 | Maa | 29/571 |
| 4,450,620 | 5/1984 | Fuls et al. | 29/571 |

Primary Examiner—George T. Ozaki
Attorney, Agent, or Firm—Lester H. Birnbaum

[57] ABSTRACT

A method of fabricating field effect transistors which includes control of threshold potential by an ion implantation limited to the active channel area. The active channel area is defined by a photoresist pattern. Ions are implanted into the exposed area in a concentration to achieve a desired threshold. Appropriate metals are deposited over the channel area to form a gate electrode. The photoresist is lifted off leaving the gate electrode in position over the channel area. If desired, a layer of polysilicon can be included prior to resist formation and later removed by an etchant which does not attack the gate electrode.

8 Claims, 7 Drawing Figures

FABRICATION OF FETS

BACKGROUND OF THE INVENTION

This invention relates to the fabrication of field effect transistors, and in particular to a method which permits control of the threshold potential of such devices.

As field effect transistors and integrated circuits in which they are used have increased in complexity and precision, the need for precisely tailoring the voltage at which the transistors turn on (i.e., threshold voltage) has become increasingly important. At the same time, the reduction in size of these devices has introduced parasitics which put severe constraints on impurity doping in the semiconductor. For example, a typical method employed to adjust threshold is to form a surface implant in the entire device area after formation of the field oxide regions and prior to formation of the source and drain regions. The gate electrodes are then defined by depositing a layer of polycrystalline silicon (polysilicon) everywhere, forming photoresist patterns over the desired gate regions and then etching the exposed polysilicon regions. This is followed by formation of the source and drain regions aligned with the gate electrodes. Such an approach is usually adequate. However, as channel lengths decrease, it is desirable to increase substrate doping to avoid so-called short channel effects which adversely affect the I-V characteristics of the transistors. If high concentration channel doping is included throughout the device area, the junction capacitances will increase thereby decreasing device speed.

Ion implantation limited to the channel regions for adjustment of threshold has been previously suggested. (See, for example, U.S. Pat. No. 4,212,100 issued to Paivinen et al, and U.S. Pat. No. 4,217,149 issued to Sawazaki.) Such techniques, which suggest use of an SiO$_2$ mask to define the implanted region, generally require separate mask alignments to form the implant and to define the gate electrodes and/or the source and drain regions.

It is therefore a primary object of the invention to provide a technique for precisely tailoring the threshold of a field effect transistor by introduction of impurities limited to the region at and below the channel of the transistor. It is a further object of the invention to provide a means for self-alignment of the impurity region with gate electrode and source and drain regions.

SUMMARY OF THE INVENTION

These and other objects are achieved in accordance with the invention which is a method of fabricating a field effect transistor including a source and drain region formed in the surface of a semiconductor substrate with a channel region therebetween. The method comprises forming a pattern of photoresist over the semiconductor, which pattern leaves the desired channel region exposed and covers the remainder of the device area in the substrate. Impurities are implanted into the exposed area of the substrate to form a surface region having a concentration which will set the threshold potential of the device to a desired level. At least one metal is deposited over the portion of the semiconductor exposed by the photoresist pattern to establish the boundaries of a gate electrode, and the photoresist pattern is removed to expose the remainder of the device area.

BRIEF DESCRIPTION OF THE DRAWING

These and other features of the invention will be delineated in detail in the following description. In the drawing.

It will be appreciated that for purposes of illustration these figures are not necessarily drawn to scale.

DETAILED DESCRIPTION

The invention will now be described with reference to the embodiment illustrated in the sequence of steps shown in FIGS. 1-7.

Figure 1:
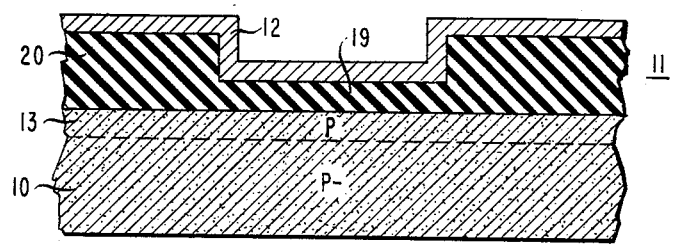
FIGS. 1-7 are cross-sectional views of a portion of an integrated circuit during various stages of fabrication in accordance with one embodiment of the invention.

FIG. 1 shows a portion of an integrated circuit at a stage of processing in accordance with a typical prior art fabrication technique. The semiconductor substrate, 10, has a bulk portion which is p-conductivity type. In this example, the substrate is doped with boron to a concentration of approximately $2 \times 10^{15}$ cm$^{-3}$. Formed in most of the surface of the substrate is a region, 13, which is also p-type, but of a lower resistivity. In this example, the region is formed by ion implantation of boron at a dose of approximately $1 \times 10^{12}$ cm$^{-2}$ to give a Gaussian profile with a peak concentration of approximately $2.5 \times 10^{16}$ cm$^{-3}$ at the surface and a concentration of approximately $1 \times 10^{16}$ cm$^{-3}$ at a depth of 0.3 μm after all heat treatments. Formed over the surface of the semiconductor by standard techniques is an insulating layer, 11, comprising SiO$_2$, which is patterned into thin regions such as 19 over the areas of the transistors and thick regions 20 for providing electrical isolation and masking functions. The thin regions are typically 250 Å thick and the thick regions are 4000 Å thick. Formed over the insulator is a layer, 12, of polycrystalline silicon which is approximately 3500 Å thick. The polysilicon layer 12 can be doped with a suitable impurity when it is deposited or at some later time in the processing.

Although region 13 is shown as covering the entire surface of the semiconductor, 10, it can be limited to the areas outside the device area and under the thick portions, 20, of the overlying oxide, 11, since it can serve primarily to control the parasitic threshold in those areas.

Figure 2:
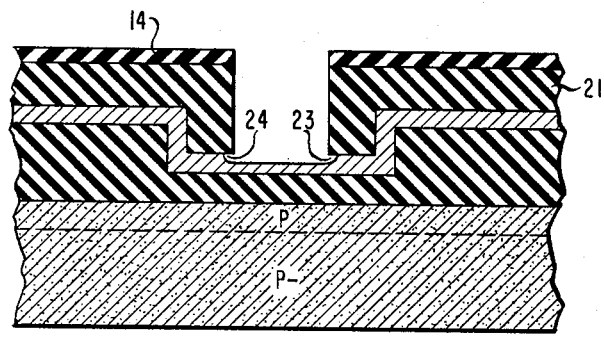

As illustrated in FIG. 2, formed over the structure are successive layers of a standard photoresist, 21, and an insulator, 14, such as SiO$_2$. The thickness of the photoresist is typically approximately 15,000 Å, while that of the SiO$_2$ layer is approximately 1000 Å. Both layers may be patterned by standard photolithography to expose the polysilicon layer, as shown, in the area above the substrate which will comprise the channel region of the transistor. The layer, 14, serves as a mask for etching the resist layer, 21, in the desired area.

Next, as also illustrated in FIG. 2, the exposed polysilicon layer is etched to provide undercut regions, 23 and 24, under the photoresist layer, 21. This is accomplished, in this example, by performing an isotropic plasma etch and thereby removing approximately 1500 Å of the polysilicon layer. Of course, this will also undercut the resist by approximately 1500 Å on each side. A recommended etchant is a mixture of CF$_4$ and O$_2$. This undercut pattern is desirable since it aids in the later lift-off operation by allowing the solvent to penetrate to the polysilicon-resist interface and remove the entire photoresist along with any material which might be deposited on the sidewalls of the resist. (See, for example, U.S. Pat. No. 4,362,597 issued to D. B. Fraser et al).

Figure 3:
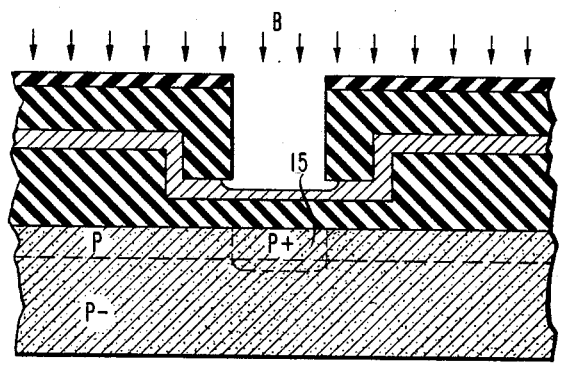

Next, as shown in FIG. 3, the structure is subject to an ion implantation of boron to form a surface region, 15, in the exposed area of the substrate. In this particular example, after all process heat treatments, the region is deep enough (approximately 0.4 $\mu$m) to penetrate beyond region 13 into the bulk of the semiconductor. The region 15 (designated p+) will have an essentially flat impurity profile after all heat treatments up to a depth of approximately 0.4 $\mu$m with an impurity concentration of approximately $3 \times 10^{16}$ cm$^{-3}$ which sets the threshold voltage of the transistor and which serves to inhibit source-to-drain punch-through currents in the bulk of the substrate. In order to achieve such depths and concentrations in this example, a recommended implant is one having a dose of $0.5 \times 10^{12}$ cm$^{-2}$ and an energy of 170 keV. If desired, two separate implants may be used to achieve the desired impurity profile. Subsequently, the exposed area can be cleaned, for example, by an oxygen sputter technique.

In cases where the channel length is in the sub-micron regime, it may be desirable to have a peak concentration of region 15 at approximately the source-drain junction depth in order to control sub-threshold currents. In such a case, the surface doping of region 15 might be typically $5 \times 10^{16}$ cm$^{-3}$ and the peak portion of region 15 in the bulk would be approximately $8 \times 10^{16}$ cm$^{-3}$. This can be achieved, for example, by implanting region 13 at a dose of $2 \times 10^{12}$ cm$^{-2}$ and then implanting region 15 at a dose of $1 \times 10^{12}$ cm$^{-2}$.

Figure 4:
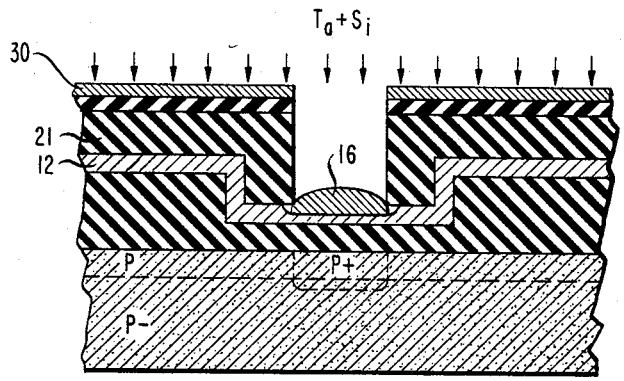

As shown in FIG. 4, the area of the polycrystalline silicon layer which will comprise the gate electrode of the transistor is then established without any additional masking. This is accomplished, in this example, by first co-depositing in the exposed area a metal such as tantalum and silicon to form the electrode, 16 (as well as the metal coating, 30, over the resist). The silicon is deposited along with the metal to prevent any significant consumption of the underlying polysilicon during the later sintering operation. In cases where the underlying polysilicon is thick enough, metal alone may be deposited. Further, the metal and silicon can be deposited sequentially rather than simultaneously, and additional silicon can be deposited first, followed by co-deposition of the metal and silicon. A recommended method of deposition is standard sputtering. Additional metals which could be employed include Co, Ti, W, and Pt.

Figure 5:
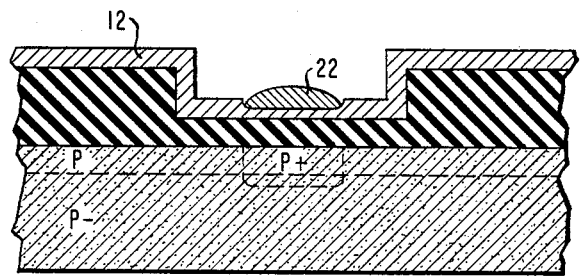

As illustrated in FIG. 5, this metal deposition establishes the dimensions of the gate electrode. The photoresist, SiO$_2$ layer, and metal coating, 30, outside the exposed area are all removed by a lift-off process involving the dissolution of the photoresist layer. This can be done, for example, by applying an anhydrous hydrazine mixture as described in U.S. Pat. No. 4,346,125 issued to Kinsbron et al. After lift-off, the deposited metal and silicon mixture, 16 of FIG. 4, is formed into a metal silicide, 22, by sintering. A typical heating cycle for tantalum and silicon would be a temperature of 900 degrees C. for 30 minutes. It may also be desirable to delay the sintering step until after the reactive sputter etching of the exposed polysilicon described below.

Figure 6:
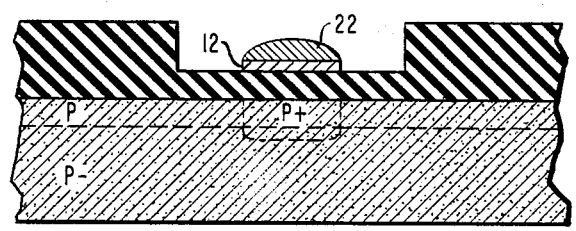

The gate electrode can then be defined, as shown in FIG. 6, by applying a reactive sputter etchant which selectively etches the polysilicon layer 12 but does not attack the silicide region 22. One such etchant is Cl$_2$. This step leaves a multilevel structure comprising the silicide 22 and the underlying polysilicon 12.

Figure 7:
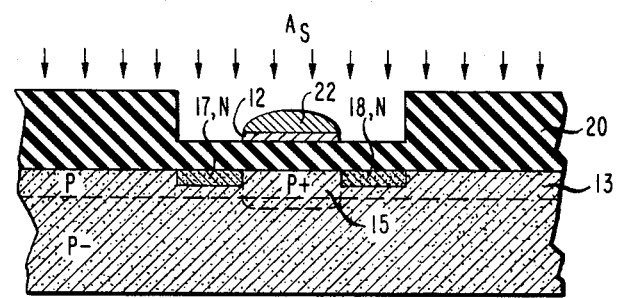

As shown in FIG. 7, the source and drain regions, 17 and 18, can then be formed in the layer 13 of the substrate by ion implantation utilizing the thick oxide portion 20, and the gate electrode 22-12 as masks. The source and drain regions are, therefore, precisely aligned with the previously formed channel surface region 15 thereby minimizing junction capacitance. In this particular example, the ion implantation comprises arsenic ions at a dose of approximately $3 \times 10^{15}$ cm$^{-2}$ with an energy of approximately 90 keV. After subsequent heat treatments, the source and drain regions are formed to a depth of approximately 0.25 $\mu$m and an impurity concentration of approximately $1 \times 10^{20}$ cm$^{-3}$. Contacts to the source and drain regions (not shown) can then be formed to complete the FET structure shown.

It will be appreciated that the invention could also be used for FETs that do not have an insulated gate.

Although the above-described example included a polysilicon layer 12 in place over the patterned oxide (FIG. 1), it should be appreciated that this is not essential to the invention. In the absence of such a layer, the silicon needed to form the silicide can be deposited along with the other metal after patterning the photoresist to expose the channel region (FIG. 4). It will also be appreciated that the p layer, 13, need not be present in the device area of the substrate and implants can be made into the bulk silicon (10) instead. It will further be appreciated that the invention is not limited to the particular conductivity types shown in the figures, and all polarities could be reversed. Also, any standard lithography techniques, including X-ray and e-beam lithography, could be used to expose the channel region for implantation. It should also be understood in the attached claims that leaving the desired channel region "exposed" is meant to permit implantation in that area while other areas of the device are masked from implantation, and does not mean that the bare surface of the semiconductor need be exposed.

Various additional modifications of the invention will become apparent to those skilled in the art. All such variations which basically rely on the teachings through which the invention has advanced the art are properly considered within the spirit and scope of the invention.

What is claimed is:

1. A method of forming a field effect transistor which includes a source and drain region formed in the surface of a semiconductor substrate with a channel region therebetween, the method comprising the steps of:

forming a pattern of photoresist over the semiconductor substrate which leaves the desired channel region exposed and covers the remainder of the device area in the substrate;

implanting impurities into the exposed area of the substrate to form a surface region having a concentration which will set the threshold potential of the device to a desired level;

depositing at least one metal over the portion of the semiconductor exposed by the photoresist pattern to establish the boundaries of the gate electrode;

removing the photoresist pattern to expose the remainder of the device area; and implanting source and drain regions into the substrate subsequent to the removal of the photoresist utilizing the gate electrode as a mask so as to align the edges of the source and drain regions with the surface region.

2. The method according to claim 1 wherein a layer of polycrystalline silicon is deposited over the semiconductor prior to forming the photoresist pattern and the patterning of the resist exposes the portion of the polycrystalline silicon which is over the desired channel region.

3. The method according to claim 2 wherein the gate electrode is defined subsequent to removal of the photoresist by converting the metal to a silicide and selectively etching portions of the polycrystalline silicon layer not covered by the silicide.

4. The method according to claim 2 further comprising the step of, prior to depositing the metal, isotropically etching a portion of the exposed polycrystalline silicon so as to undercut the photoresist pattern.

5. The method according to claim 1 wherein the substrate includes a surface layer having a higher impurity concentration than the bulk of the substrate, and the implanted surface region extends through the surface layer and into the bulk of the substrate.

6. The method according to claim 1 wherein silicon is deposited along with said one metal over the portion of the semiconductor exposed by the photoresist pattern.

7. The method according to claim 1 wherein the said one metal is selected from the group consisting of tantalum, cobalt, titanium, tungsten, and platinum.

8. A method of forming a field effect transistor which includes a source and drain region of one conductivity type formed in the surface of a semiconductor substrate of opposite conductivity type with a channel region therebetween, the method comprising the steps of:

forming over the semiconductor substrate an insulating layer which includes thin portions over the transistor area and thick portions over areas outside the transistor area;

forming a layer of polycrystalline silicon over the insulating layer;

forming a pattern of photoresist on the polycrystalline silicon layer which leaves exposed the area of the polycrystalline silicon layer over the desired channel region and covers the area of the polycrystalline silicon over the remainder of the device area;

isotropically etching a portion of the exposed polycrystalline silicon to undercut the photoresist pattern;

implanting impurities through the exposed polycrystalline silicon layer and insulating layer into the substrate to form a surface region of the same conductivity as the substrate which sets the threshold potential of the transistor to a desired level and inhibits source-to-drain punch-through currents;

depositing at least one metal onto the exposed polycrystalline silicon;

removing the photoresist pattern to expose the remainder of the polycrystalline silicon;

heating the structure to form a metal silicide over the surface region;

selectively removing the polycrystalline silicon without affecting the metal silicide; and implanting the source and drain regions into the surface of the substrate using the metal silicide and thick insulating portions as a mask so as to align the source and drain regions with the surface region.

* * * * *